(12) United States Patent
Bao et al.

(10) Patent No.: US 9,343,372 B1
(45) Date of Patent: May 17, 2016

(54) METAL STACK FOR REDUCED GATE RESISTANCE

(71) Applicant: GLOBALFOUNDRIES INC., Grand Cayman (KY)

(72) Inventors: Ruqiang Bao, Wappingers Falls, NY (US); Unoh Kwon, Fishkill, NY (US); Rekha Rajaram, Scarsdale, NY (US); Keith Kwong Hon Wong, Wappingers Falls, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 14/583,835

(22) Filed: Dec. 29, 2014

(51) Int. Cl.
*H01L 21/8238* (2006.01)
*H01L 27/092* (2006.01)
*H01L 29/40* (2006.01)
*H01L 29/51* (2006.01)
*H01L 21/3213* (2006.01)
*H01L 29/66* (2006.01)
*H01L 29/49* (2006.01)

(52) U.S. Cl.
CPC .. *H01L 21/823828* (2013.01); *H01L 21/32134* (2013.01); *H01L 27/092* (2013.01); *H01L 27/0922* (2013.01); *H01L 29/401* (2013.01); *H01L 29/4966* (2013.01); *H01L 29/517* (2013.01); *H01L 29/518* (2013.01); *H01L 29/66545* (2013.01)

(58) Field of Classification Search
CPC ................................................. H01L 21/823807
USPC ........................................... 257/369; 438/592
See application file for complete search history.

(56) References Cited

U.S. PATENT DOCUMENTS

| | | |
|---|---|---|
| 7,064,066 B1 | 6/2006 | Metz et al. |
| 2013/0017679 A1 | 1/2013 | Lenski et al. |
| 2013/0203231 A1 | 8/2013 | Fitzsimmons et al. |
| 2013/0320414 A1 | 12/2013 | Fan et al. |
| 2015/0132953 A1* | 5/2015 | Nowling ........... H01L 21/32133 438/692 |
| 2016/0020180 A1* | 1/2016 | Peng ................... H01L 23/564 257/329 |

* cited by examiner

*Primary Examiner* — Edward Wojciechowicz
(74) *Attorney, Agent, or Firm* — Yuanmin Cai; Hoffman Warnick LLC

(57) ABSTRACT

A method includes forming an n-FET device and a p-FET device on a substrate, each of the n-FET device and the p-FET device include a metal gate stack consisting of a titanium-aluminum carbide (TiAlC) layer above and in direct contact with a titanium nitride (TiN) cap, and removing, from the p-FET device, the TiAlC layer selective to the TiN cap. The removal of the TiAlC layer includes using a selective TiAlC to TiN wet etch chemistry solution with a substantially high TiAlC to TiN etch ratio such that the TiN cap remains in the p-FET device.

20 Claims, 13 Drawing Sheets

METAL STACK FOR REDUCED GATE RESISTANCE

BACKGROUND

The present invention generally relates to semiconductor devices and more particularly to forming n-type field effect transistor (n-FET) devices having reduced gate resistance.

Complementary Metal-oxide-semiconductor (CMOS) technology is commonly used for fabricating field effect transistors (FET) as part of advanced integrated circuits (IC), such as CPUs, memory, storage devices, and the like. Most common among these may be metal-oxide-semiconductor field effect transistors (MOSFET), in which a gate structure may be energized to create an electric field in an underlying channel region of a semiconductor substrate, by which charge carriers are allowed to travel through the channel region between a source region and a drain region of the semiconductor substrate. The gate structure may be formed above the channel region and may generally include a gate dielectric layer as a part of or underneath other gate elements. The gate dielectric layer may include an insulator material, which may prevent leakage currents from flowing into the channel region when a voltage is applied to a gate electrode, while allowing the applied voltage to set up a transverse electric field in the channel region in a controllable manner.

In a replacement metal gate (RMG) fabrication approach, a dummy gate may be formed in the semiconductor substrate. The dummy gate may be patterned and etched from a polysilicon layer above the semiconductor substrate. In fin field effect transistor (FinFET) devices, the dummy gate may be formed over a portion of one or more fins formed from the semiconductor substrate. In some cases, the dummy gate may be formed surrounding a nanowire or above a semiconductor-on-insulator (SOI) substrate. Gate spacers may be formed on opposite sidewalls of the dummy gate. The dummy gate and the gate spacers may then be surrounded by an interlevel dielectric (ILD) layer. Later, the dummy gate may be removed from between the gate spacers, as by, for example, etch processes such as reactive ion etch (RIE) or wet etch chemistry. This may create a trench between the gate spacers where a metal gate, or gate electrode, may then be formed. One or more gate dielectric layers may be generally configured below the metal gate, where numerous layers of workfunction metals may be generally formed. Then, a low resistive metal may be deposited as a gate electrode to fill a remaining portion of the trench. This sequence of layers including the gate dielectric layers, the workfunction metals and the low resistive electrode metal may be referred to as a metal gate stack.

SUMMARY

According to an embodiment of the present disclosure, a method may include forming an n-FET device and a p-FET device on a substrate, each of the n-FET device and the p-FET device may include a metal gate stack consisting of a titanium-aluminum carbide (TiAlC) layer above and in direct contact with a titanium nitride (TiN) cap, and removing, from the p-FET device, the TiAlC layer selective to the TiN cap, where removing the TiAlC layer may include using a selective TiAlC to TiN wet etch chemistry solution with a substantially high TiAlC to TiN etch ratio such that the TiN cap may remain in the p-FET device.

According to another embodiment of the present disclosure, a method may include forming, on a semiconductor substrate, an n-FET device and a p-FET device, each of the n-FET and p-FET devices may include a dummy gate, removing the dummy gate in the n-FET device and the p-FET device, where removing the dummy gate may create a first recess in each of the n-FET device and the p-FET device, depositing in the first recess a high-κ dielectric layer, the high-κ dielectric layer substantially covering a perimeter of the first recess, depositing a first metal layer above and in direct contact with the high-κ dielectric layer, the first metal layer including a TiN cap, where a portion of the first recess remains above the first metal layer to become a second recess, depositing, in the second recess, a second metal layer including TiAlC, the second metal layer located above and in direct contact with the first metal layer, depositing a third metal layer including TiN, the third metal layer located above and in direct contact with the second metal layer, wherein the high-κ dielectric layer, the first metal layer, the second metal layer and the third metal layer form an n-type metal gate stack for the n-FET device, depositing a protective layer substantially covering the n-FET device, etching the third metal layer from the p-FET device selective to the second metal layer, etching the third metal layer may include using a first wet etch chemistry solution including hydrogen peroxide (H2O2), and etching the second metal layer from the p-FET device selective to the first metal layer, etching of the second metal layer may include using a second wet etch chemistry solution with a substantially high TiAlC to TiN etch ratio such that the first metal layer may remain in the p-FET device.

According to another embodiment of the present disclosure, a structure may include an n-FET device and a p-FET device on a semiconductor substrate, the n-FET device may include a first metal gate stack consisting of a first high-κ dielectric layer, a first TiN cap directly above the first high-κ dielectric layer, a first TiAlC layer directly above the first TiN cap, a first TiN layer directly above the first TiAlC layer, a first wetting TiN layer and a first low resistance conductive material directly above the first wetting TiN layer, the p-FET device may include a second metal gate stack consisting of a second high-κ dielectric layer, a second TiN cap directly above the second high-κ dielectric layer, a second wetting TiN layer and a second low resistance conductive material directly above the second wetting TiN layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
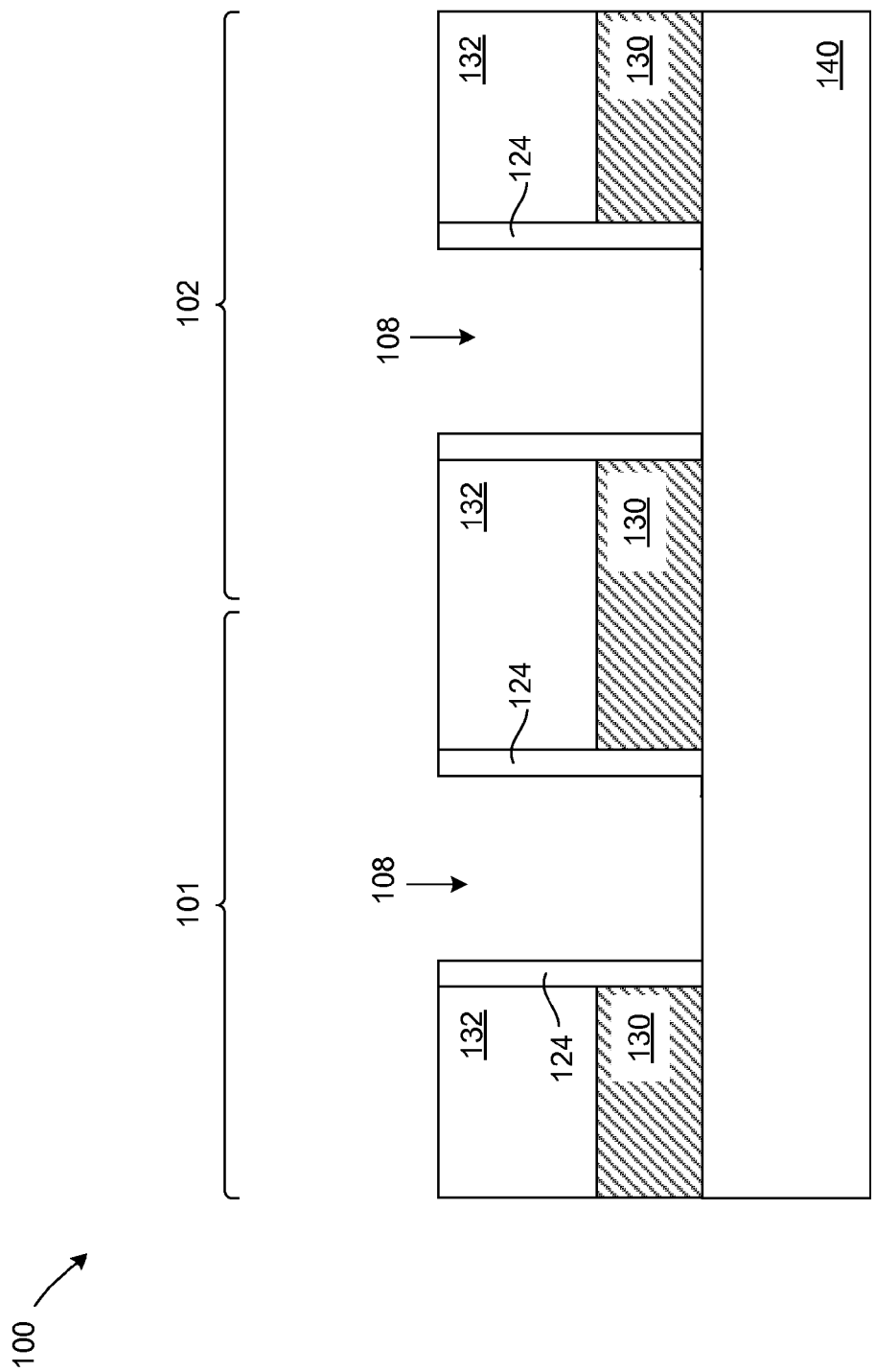
FIG. 1 is a cross-sectional view of a semiconductor structure after removing a dummy gate, according to an embodiment of the present disclosure.

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A replacement metal gate (RMG) process architecture may help preventing problems related to workfunction material stability typically seen in a gate first architecture. In an RMG process, a dummy gate structure may be used to self-align a source and drain implant and anneals, then the dummy gate materials may be stripped out and replaced with a high-κ dielectric and metal gate materials. Despite of its complexity, the RMG flow may provide advantages over a gate first approach including, for example, the use of separate n-FET and p-FET metals for workfunction optimization.

As integrated circuits continue to scale downward in size, reduction of metal gate stack resistance in RMG processes may present several challenges to current complementary metal oxide semiconductor (CMOS) technology mainly due to the increasing complexity of the device structure, for example, FinFETs, smaller gate critical dimension, and limited choice of gate materials, this may be particularly true for 14 nm node and beyond.

In RMG processes there are two options for metal gate patterning: n-FET first patterning or p-FET first patterning. During an n-FET first patterning scheme, the n-FET metals may be formed and then protected to remove them from the p-FET region and form the p-FET metal gate stack. The opposite may occur during a p-FET first patterning. An advantage of n-FET first patterning over p-FET first patterning may be that the high-κ dielectric material in the n-FET region may not be exposed to the patterning wets and may not be attacked during removal of the n-FET stack from the p-FET region. This may be favorable since there is more concern about leakage in n-FET devices than in p-FET devices for a high-κ dielectric material of the same thickness due to band offset, particularly for scaled gate dielectric. However, the portion of the high-κ dielectric layer in the p-FET region may be attacked by wets or RIE during patterning, this may degrade the quality of the high-κ dielectric layer in the p-FET region. Typically, during n-FET first patterning, the n-FET metal workfunction stack is completely removed from the p-FET region allowing the deposition of a new p-FET workfunction metal or metal stack. In advanced CMOS technology, atomic layer deposition (ALD) or ALD-like chemical vapor deposition (CVD) techniques may be used to deposit gate metals during RMG processes. After deposition, the p-FET workfunction metals may be in contact with two different substrates or materials. For example, the p-FET workfunction metal may be in contact with a n-type metal layer (metal on metal) in the n-FET region while in the p-FET region they may be in contact with the high-κ dielectric (metal on insulator). Usually, metal deposition on insulators may exhibit longer nucleation delay than metal deposition on another metal. As a result, the p-FET workfunction metal in the n-FET stack may be thicker than that of the p-FET stack. This may reduce the amount of conductive material that may be deposited in the n-FET region causing n-FET devices to have a substantially high resistance. In an n-FET first patterning, n-FET gate resistance is usually higher than p-FET gate resistance since the p-FET metal stack may generally be defined by a simple workfunction metal layer followed by a conductive electrode metal. Therefore, it would be advantageous to reduce the n-FET gate resistance in n-FET first patterning schemes.

Annealed titanium nitride (TiN) may help improving reliability of the high-κ dielectric. Due to regrowth and work function shift concerns, it may be difficult to implement additional annealing steps to treat the titanium nitride after workfunction deposition in RMG schemes. Titanium nitride may provide a good high κ-dielectric cap layer which may also serve as a barrier to prevent n-FET workfunction metals from directly contacting the high-κ dielectric layer. Direct contact between workfunction metals and high-κ dielectric may usually result in regrowth of the dielectric layer. More specifically, because the typical n-FET workfunction metals may include aluminum (Al) and titanium (Ti) related elements, additional oxide layers may be formed from them causing the effective dielectric to be thicker when n-FET workfunction metals are directly deposited on the dielectric layer.

The reduced thickness of the titanium nitride cap layer may allow for it to be annealed and retained in the p-FET region to improve the dielectric reliability. By keeping the titanium nitride cap layer as p-FET workfunction metal, a thinner p-FET metal stack (or no additional p-FET metals) may be required. In such cases, additional space may be available in the n-FET region to deposit a low resistance conductor material which may lower n-FET gate resistance. However, keeping the titanium nitride cap layer in the metal gate stacks may require a highly selective wet etch chemistry. Traditional RMG schemes may still rely on etching techniques that may hinder keeping the titanium nitride reliability cap as part of the metal gate stack.

By using a highly selective titanium-aluminum carbide to titanium nitride wet etch chemistry, embodiments of the present disclosure may, among other potential benefits, allow modifying a typical RMG scheme such that an improved metal gate stack configuration may be achieved in order to reduce n-FET gate resistance, the proposed RGM scheme may also improve p-FET negative-bias temperature instability (NBTI) for enhanced device performance.

The present invention generally relates to semiconductor devices and more particularly to forming n-type field effect transistor (n-FET) devices having reduced gate resistance. One way to form the n-FET devices with reduced gate resistance may include using a wet etch chemistry with a high titanium-aluminum carbide to titanium nitride etch ratio to selectively remove an n-type workfunction metal (titanium-aluminum carbide) from the p-FET device while keeping a titanium nitride cap layer. One embodiment by which to form the n-FET metal gate stack for reduced gate resistance is described in detail below by referring to the accompanying drawings in FIGS. 1-13.

Referring now to FIG. 1, a semiconductor structure 100 is shown after removal of a dummy gate, according to an embodiment of the present disclosure. The semiconductor structure 100 may include a plurality of field effect transistor (FET) devices. In one exemplary embodiment, the plurality of FET devices in the semiconductor structure 100 may include at least one n-FET device 101 and at least one p-FET device 102. The semiconductor structure 100 may be for example, a planar FET device, a fin field effect transistor (FinFET) device or a nanowire device.

At this point of the RMG process, a dummy gate (not shown) have been removed from the n-FET device 101 and the p-FET device 102, respectively. It should be noted that the process of removing the dummy gate (not shown) is typical and well known to those skilled in the art. A first recess 108 may remain in each of the n-FET device 101 and the p-FET device 102 between gate spacers 124 after removal of the dummy gate (not shown).

The n-FET and p-FET devices 101, 102 may be formed on a semiconductor substrate 140 which may be, for example, a semiconductor-on-insulator (SOI) substrate, where a buried insulator layer (not shown) separates a base substrate (not shown) from a top semiconductor layer. The components of the semiconductor structure 100 may then be formed in or adjacent to the top semiconductor layer. In other embodiments, the semiconductor substrate 140 may be a bulk semiconductor substrate which may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide.

The gate spacers 124 may be made of any insulating material, such as silicon nitride, silicon oxide, silicon oxynitrides, or a combination thereof, and may have a thickness ranging from approximately 2 nm to approximately 100 nm, preferably approximately 2 nm to approximately 25 nm. The gate spacers 124 may be formed by any method known in the art, including depositing a conformal silicon nitride layer (not shown) over the dummy gates (not shown) and removing unwanted material from the conformal silicon nitride layer using a anisotropic etching process such as, for example, reactive ion etching (RIE) or plasma etching. Methods of forming spacers are well-known in the art and other methods are explicitly contemplated. Further, in various embodiments, the gate spacers 124 may include one or more layers. While the gate spacers 124 are herein described in the plural, the gate spacers 124 may consist of a single spacer.

Source-drain regions 130 may be formed on the semiconductor substrate 140 adjacent to the gate spacers 124. Numerous methods of forming source-drain regions are known in the art, any of which may be used to form the source-drain regions 130. In some embodiments, the source-drain regions 130 may be formed by doping portions of the semiconductor substrate 140. In other embodiments, the source-drain regions 130 may be formed by growing epitaxial semiconductor regions adjacent to the semiconductor substrate 140. The epitaxial semiconductor regions may extend above and/or below the top surface of the semiconductor substrate 140.

The semiconductor structure 100 may also include an interlevel dielectric layer 132. The interlevel dielectric layer 132 may fill the gaps between two adjacent devices, such as the n-FET device 101 and the p-FET device 102, and other existing devices within the semiconductor structure 100. The interlevel dielectric layer 132 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics. The process of forming the interlevel dielectric layer 132 is well known to those skilled in the art and may include any known deposition technique including ALD, CVD, plasma enhanced CVD, spin on deposition, or PVD. In some embodiments, various barriers or liners (not shown) may be formed below the interlevel dielectric layer 132.

It may be understood that additional processing steps may be performed prior to the removal of the dummy gate. For example, an interfacial layer (not shown) may have been formed on the semiconductor substrate 140 by any known technique in the art. The interfacial layer may typically include a thermal oxide or a chemical oxide. The interfacial layer may be usually formed before a high-κ dielectric layer is deposited.

Figure 2:
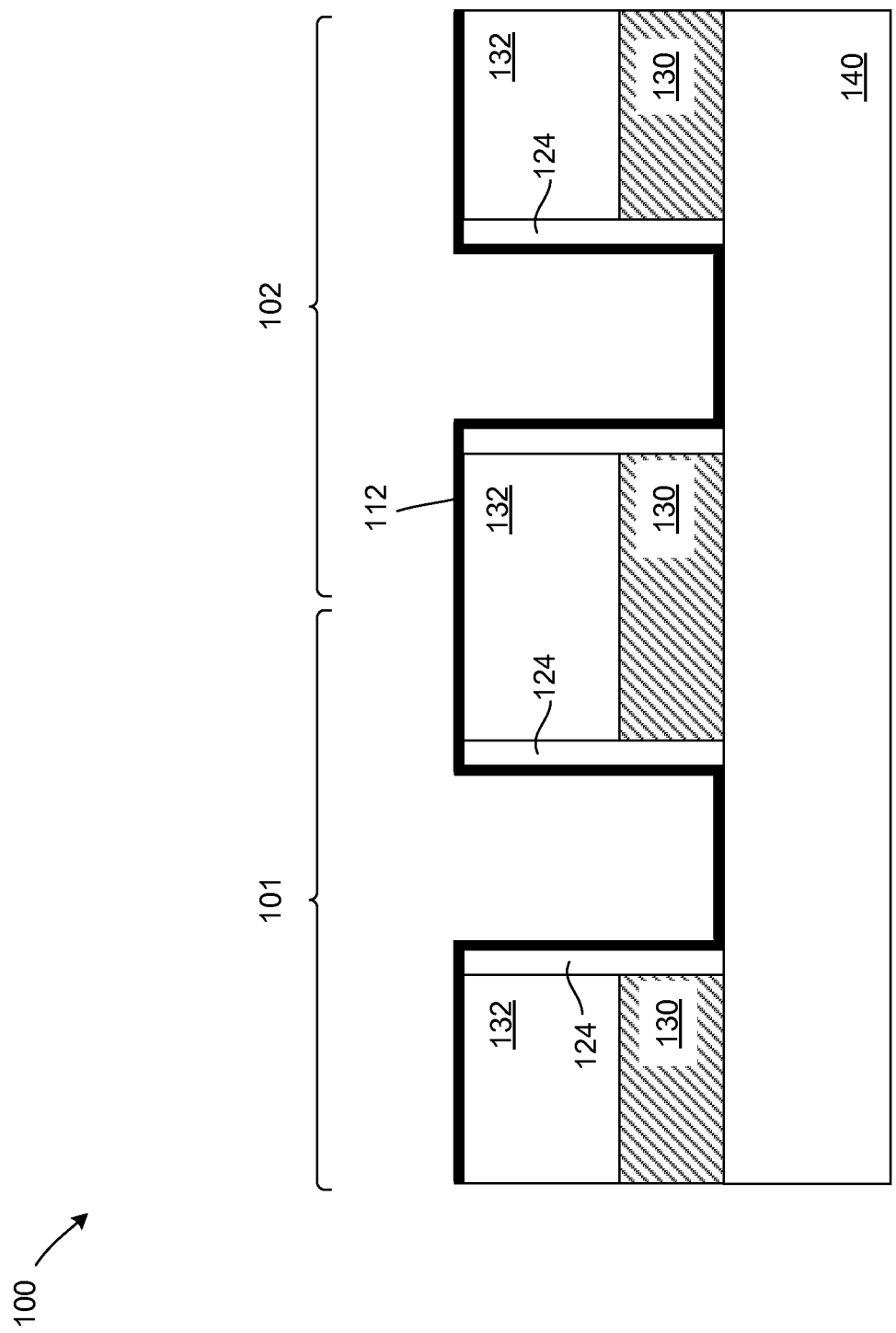
FIG. 2 is a cross-sectional view of the semiconductor structure depicting forming a high-κ dielectric layer, according to an embodiment of the present disclosure.

Referring now to FIG. 2, a gate dielectric layer 112 may be formed in the first recesses 108 (FIG. 1), according to an embodiment of the present disclosure. The gate dielectric layer 112 may include a high-κ dielectric material having a dielectric constant greater than, for example, 3.9, which is the dielectric constant of silicon oxide. The gate dielectric layer 112 may be formed by any method known in the art including, for example, CVD, ALD, molecular beam deposition (MBD), pulsed laser deposition (PLD), liquid source misted chemical deposition (LSMCD), etc. In one embodiment, the dielectric metal oxide of the gate dielectric layer 112 may include a metal and oxygen, and optionally nitrogen and/or silicon. Specific examples of high-κ dielectric materials may include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x may vary independently from 0.5 to 3 and each value of y may vary independently from 0 to 2. The gate dielectric layer 112 may have a thickness ranging from approximately 1 nm to approximately 10 nm, and more specifically from approximately 1 nm to approximately 3 nm.

Following the formation of the gate dielectric layer 112, an optional anneal step may be performed to densify the high-κ material. It should be noted that post-deposition treatments like annealing or nitration may be conducted to treat the high-κ dielectric material forming the gate dielectric layer 112 such that defects in the high-κ dielectric material may be removed, or to densify the high-κ dielectric material in order to improve the quality of the gate dielectric layer 112. In embodiments in which an interfacial layer exists in the semiconductor substrate 140, the gate dielectric layer 112 may be formed in direct contact with the interfacial layer in the dummy gate region.

Figure 3:
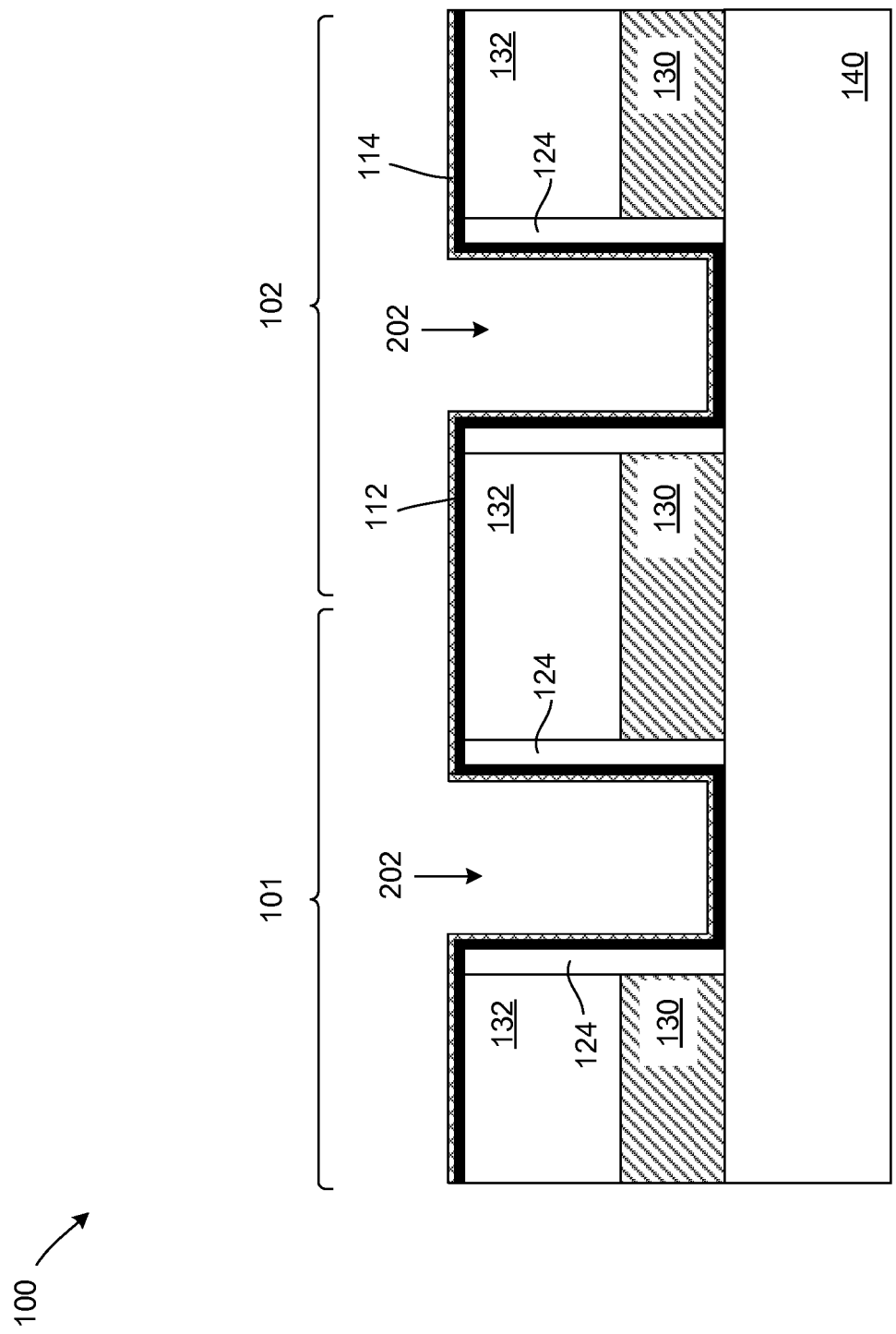
FIG. 3 is a cross-sectional view of the semiconductor structure depicting forming a first metal layer, according to an embodiment of the present disclosure.

Referring now to FIG. 3, a first metal layer 114 may be formed above and in direct contact with the gate dielectric layer 112, according to an embodiment of the present disclosure. The first metal layer 114 may protect the gate dielectric layer 112 during subsequent processing steps for improved reliability. The first metal layer 114 may be, for example, a fresh deposited titanium nitride film or annealed titanium nitride film. Annealed titanium nitride may help improving the high-κ dielectric reliability. More specifically, due to regrowth and workfunction shift concerns, it may be difficult to implement additional annealing steps to treat titanium nitride for enhanced high-κ dielectric reliability after workfunction deposition in RMG schemes. The annealed titanium nitride forming the first metal layer 114 may provide a good high-κ dielectric cap layer (e.g. titanium nitride reliability cap), functioning as a barrier to prevent n-FET metals from directly contacting the high-κ gate dielectric layer 112. Direct contact of n-FET metals with the gate dielectric layer 112 may usually result in regrowth of the gate dielectric layer 112. Since typical n-FET metals may include aluminum (Al) and titanium (Ti) related elements, additional oxide layers may be formed causing a thicker effective dielectric layer when n-FET metals are directly deposited on the gate dielectric layer 112. Therefore, the first metal layer 114 may exhibit a reduced thickness which may allow annealing and retention of the first metal layer 114 during device manufacturing in order to improve the reliability of the gate dielectric layer 112, particularly in p-FET devices. It should be noted that during traditional RMG n-FET first patterning schemes the first metal layer 114 may not be kept in the p-FET devices. However, in order to keep the first metal layer 114 in the p-FET device 102 for improved reliability, a highly selective wet etch chemistry may be required, as will be described in detail below.

The first metal layer 114 may be conformally deposited by any method known in the art. For example, the first metal layer 114 may be formed by, for example, ALD followed by an optional annealing step as described above, the optional annealing step may depend on device requirements. The first metal layer 114 may have a thickness ranging from approximately 0.5 nm to approximately 2 nm. It should be noted that second recesses 202 may remain above the first metal layer 114 in the n-FET device 101 and the p-FET device 102, respectively.

Figure 4:
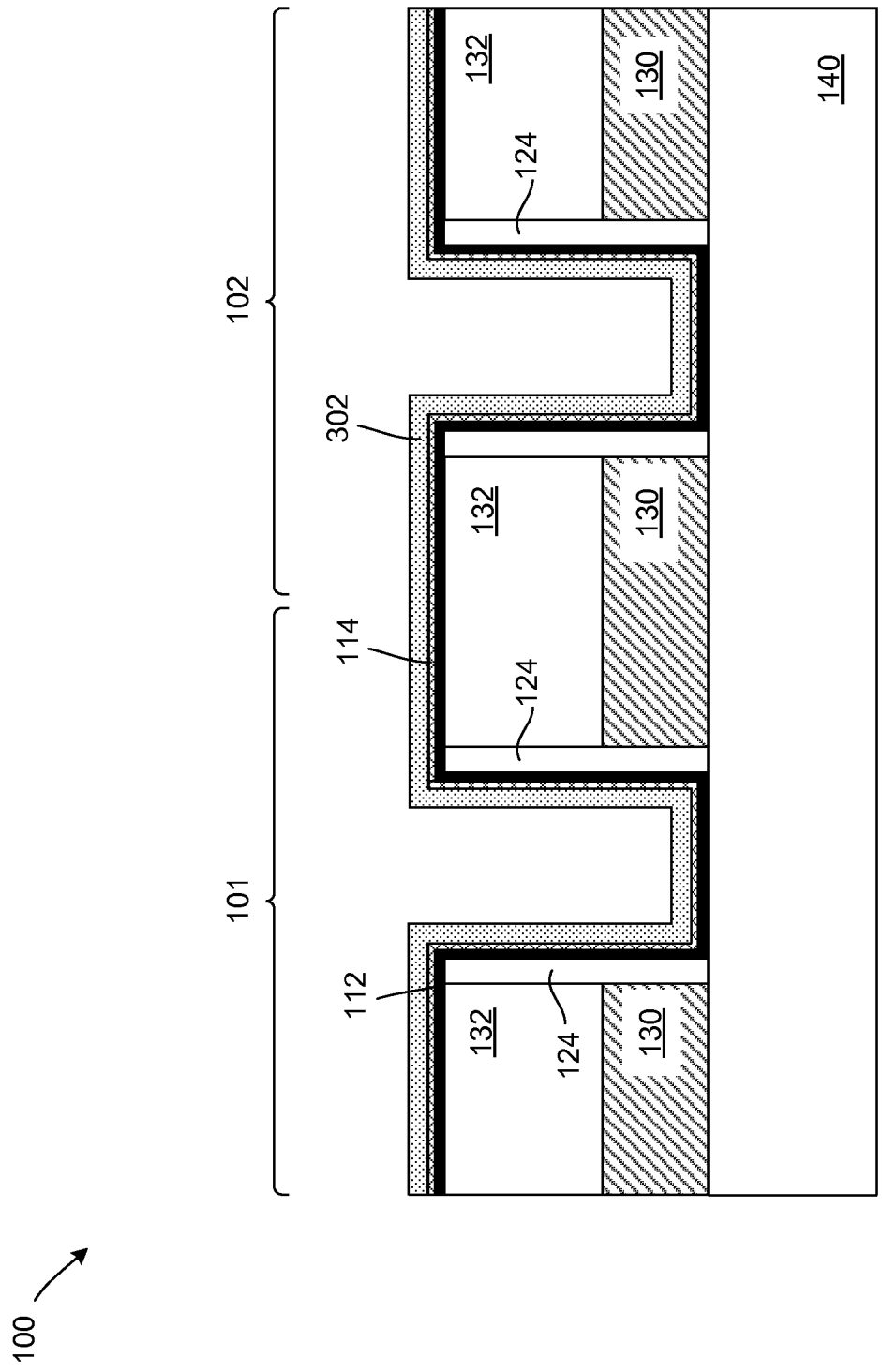
FIG. 4 is a cross-sectional view of the semiconductor structure depicting forming a second metal layer, according to an embodiment of the present disclosure.

Referring now to FIG. 4, a second metal layer 302 may be conformally deposited in the semiconductor structure 100, according to an embodiment of the present disclosure. The second metal layer 302 may be located above and in direct contact with the first metal layer 114 substantially covering a perimeter of the second recesses 202 (FIG. 3). The second metal layer 302 may include an n-type workfunction metal suitable for the n-FET device 101. In the present embodiment, the second metal layer 302 may include titanium-aluminum carbide (TiAlC). The second metal layer 302 may be formed by any deposition method known in the art, for example, ALD. The second metal layer 302 may have a thickness varying from approximately 2 nm to approximately 7 nm.

Figure 5:
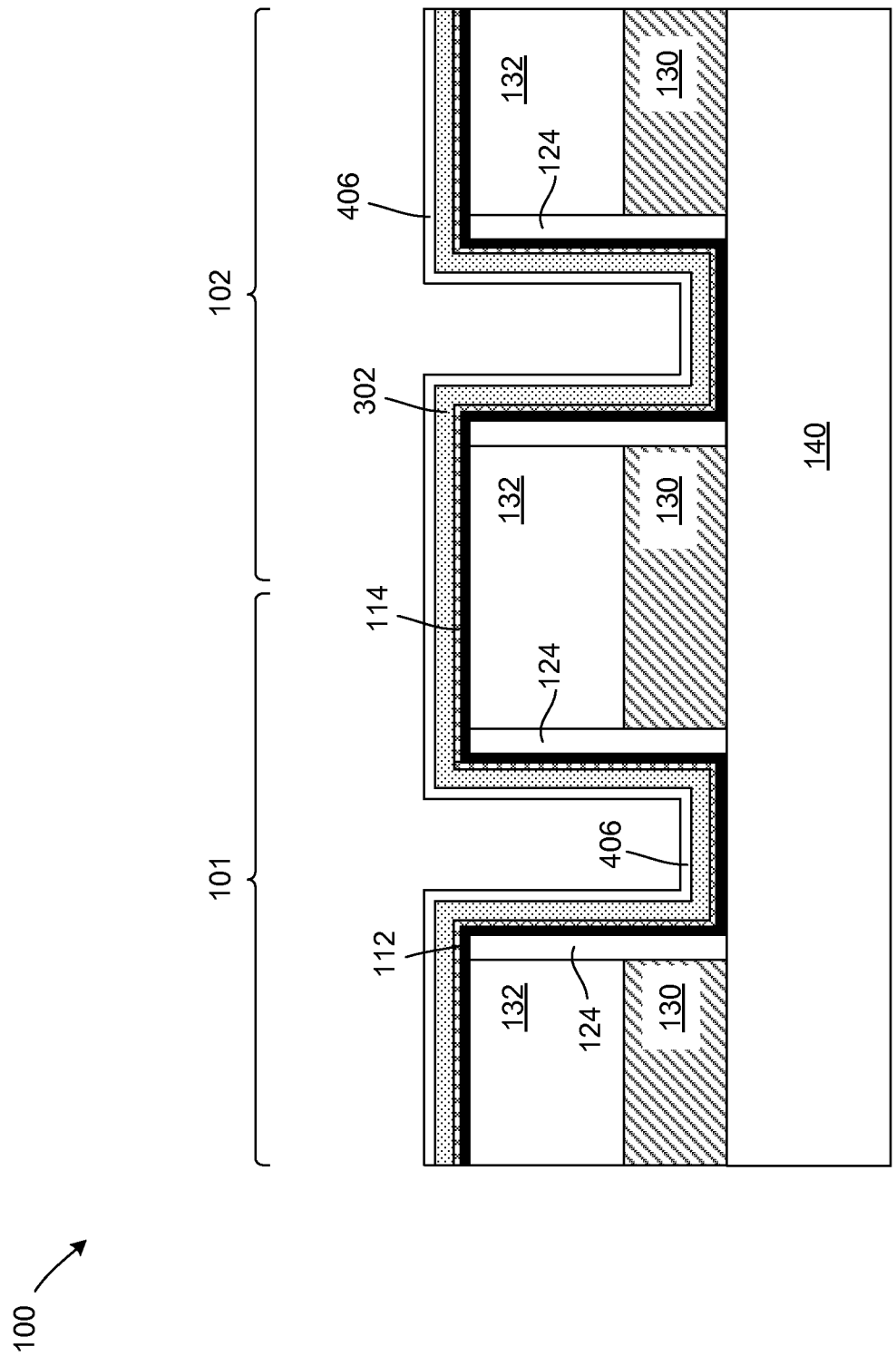
FIG. 5 is a cross-sectional view of the semiconductor structure depicting forming a third metal layer, according to an embodiment of the present disclosure.

Referring now to FIG. 5, a third metal layer 406 may be optionally formed above and in direct contact with the second metal layer 302 for patterning purposes, according to an embodiment of the present disclosure. More specifically, the gate dielectric layer 112, the first metal layer 114, the second metal layer 302, and the third metal layer 406 may form an n-type metal gate stack for the n-FET device 101. It should be noted that the first metal layer 114, the second metal layer 302, and the third metal layer 406 may be deposited in-situ, for example, without air break between them. The proposed n-type metal gate stack includes the first metal layer 114 (e.g. titanium nitride reliability cap) which may acts as a barrier to prevent direct contact of the second metal layer 302 and the third metal layer 406, and may protect the second metal layer 302 during formation of a protective layer.

The third metal layer 406 may include, for example, titanium nitride (TiN). The third metal layer 406 may be formed by any deposition method known in the art, for example, ALD or PVD. The third metal layer 406 may have a thickness varying from approximately 1 nm to approximately 3 nm.

It should be noted that in the proposed n-FET first patterning scheme the high-κ dielectric (gate dielectric layer 112) in the n-FET device 101 may not be exposed to patterning chemistry and may not be attacked during n-FET patterning, this may be favorable since n-FET devices typically have an intrinsic higher leakage than p-FET devices due to a smaller band offset of high-κ dielectric to silicon (Si) band edge. The titanium nitride layer (e.g. third metal layer 406) may be as thin as a couple of Angstrom to protect the second metal layer 302.

Figure 6:
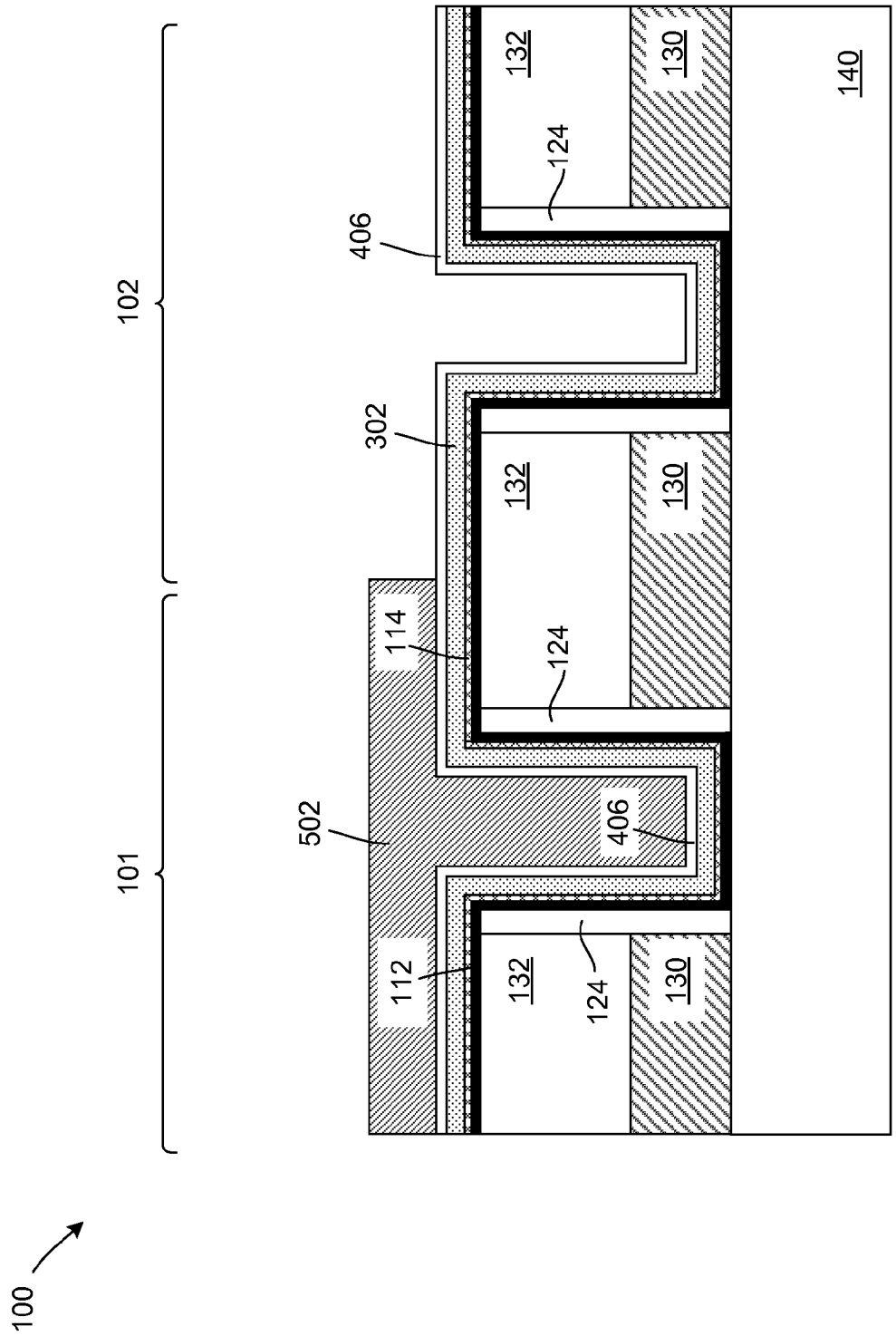
FIG. 6 is a cross-sectional view of the semiconductor structure depicting forming a protective layer to cover an n-FET device during patterning, according to an embodiment of the present disclosure.

Referring now to FIG. 6, a protective layer 502 may be deposited and patterned to cover the n-FET device 101, according to an embodiment of the present disclosure. The protective layer 502 may protect the n-FET device 101 during subsequent processing steps conducted in the p-FET device 102. More specifically, by forming the protective layer 502, the n-type metal gate stack formed by the gate dielectric layer 112, the first metal layer 114, the second metal layer 302, and the third metal layer 406 may be protected during removal of the second metal layer 302 and the third metal layer 406 (e.g. n-type workfunction metals) from the p-FET device 102.

The protective layer 502 may include one or more layers of any known organic spin material. In one embodiment, the protective layer 502 may include an organic planarization layer (OPL) or spin-on carbon layer. The protective layer 502 may be deposited by any deposition method known in the art.

Figure 7:
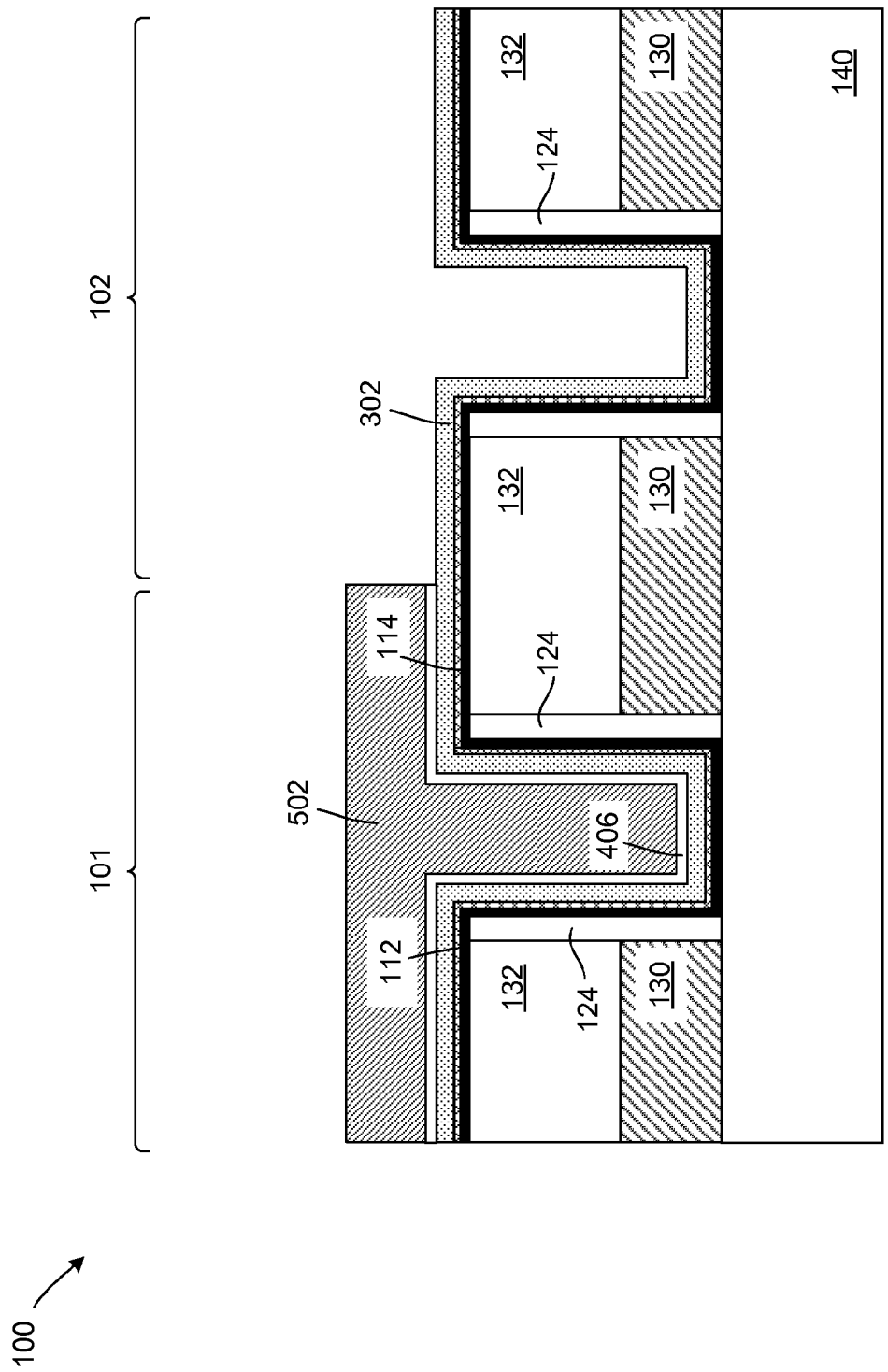
FIG. 7 is a cross-sectional view of the semiconductor structure depicting removing the third metal layer from a p-FET device, according to an embodiment of the present disclosure.

Referring now to FIG. 7, the third metal layer 406 may be selectively removed from the p-FET device 102, according to an embodiment of the present disclosure. More specifically, the third metal layer 406 may be removed selectively to the second metal layer 302 underneath by using any known wet etch chemistry solution known in the art. In embodiments in which the third metal layer 406 is TiN and the second metal layer 302 is TiAlC, a hydrogen peroxide ($H_2O_2$) etching solution may be used to selectively remove the third metal layer 406 from the p-FET device 102.

Figure 8:
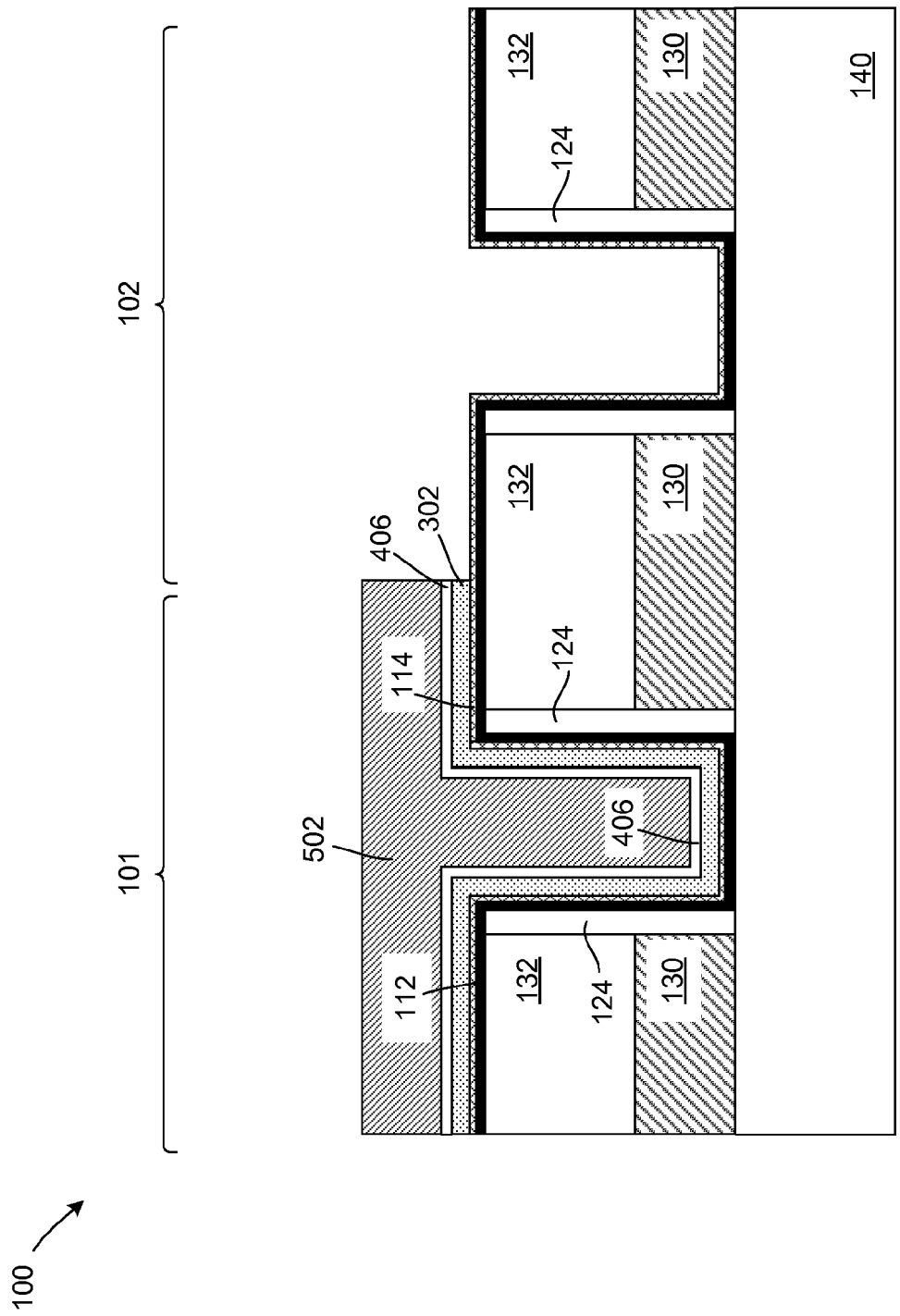
FIG. 8 is a cross-sectional view of the semiconductor structure depicting removing the second metal layer and the third metal layer from the p-FET device, according to an embodiment of the present disclosure.

Referring now to FIG. 8, the second metal layer 302 may be selectively removed from the p-FET device 102, according to an embodiment of the present disclosure. More specifically, the second metal layer 302 may be removed selective to the first metal layer 114 underneath by using a highly selective wet etch chemistry. It should be noted that the selective removal of titanium nitride (third metal layer 406) to titanium-aluminum carbide (second metal layer 302) described above with reference to FIG. 7 may be typical and easier to achieve than the selective removal of titanium-aluminum carbide (second metal layer 302) to titanium nitride (first metal layer 114). The highly selective wet etch chemistry may allow the first metal layer 114 (titanium nitride reliability cap) to remain as part of the p-FET workfunction metals.

A wet etch chemistry solution formulated to achieve a substantially high titanium-aluminum carbide to titanium nitride etch ratio may be used to selectively remove the second metal layer 302. The highly selective wet etch chemistry solution may include hydrogen peroxide ($H_2O_2$) and ammonia ($NH_4OH$) with a ratio of approximately 1:0.8 to approximately 1:10. In a preferred embodiment, a high ammonia solution may be used to achieve the high selective etching. The overall concentration of ammonia may be greater than 2% volume. A temperature of the wet etch chemistry solution may be less than 35° C. In some embodiments, temperatures lower than 35° C. may be used.

Experimental results showed that by reducing the ratio of $H_2O_2$ to $NH_4OH$ at a fixed $H_2O_2$ concentration in the solution, the etch ratio of TiAlC to TiN is increased, whereas by increasing the $H_2O_2$ concentration at a fixed ratio of $H_2O_2$ to $NH_4OH$ in the solution the etch ratio of TiAlC to TiN is reduced. More specifically, the highly selective etch ratio of TiAlC to TiN may be achieved by using low concentrations of $H_2O_2$ and $NH_4OH$ with a high ratio of $NH_4OH$ to $H_2O_2$. It should be noted that experimental data have shown that a high temperature wet etch solution may reduce the etch ratio of TiAlC to TiN.

In some embodiments the TiAlC (second metal layer 302) to TiN (first metal layer 114) etch ratio may be approximately 25:1 (2500%) or higher depending on the process conditions. This high TiAlC to TiN etch ratio may allow the removal of the second metal layer 302 selective to the first metal layer 114 as depicted in the figure. By doing so, the first metal layer 114 may remain in the p-FET device 102 substantially covering the gate dielectric layer 112. Because of the treated titanium nitride film used to form the first metal layer 114 additional nitrogen incorporation may be reduced during the subsequent metal and low conductive electrode metal deposition, this may in turn improve negative-bias temperature instability (NBTI) and lower threshold voltage (Vt) in the p-FET device 102.

It should be noted that the n-FET metal gate stack and the p-FET metal gate stack in the semiconductor structure 100 may differ from traditional metal gate stacks achieved during typical RMG process. For example, the first metal layer 114 may remain in the n-FET device 101 and the p-FET 102 to preserve the integrity of the gate dielectric layer 112 underneath. Further, a thinner titanium nitride wetting layer may be subsequently deposited above the retained first metal layer 114 in the p-FET device 102, as will be described in detail below.

The use of the proposed highly selective etching solution to remove the second metal layer 302 is fundamental for implementing the proposed RMG scheme such that improved metal gate stacks may be formed in the n-FET device 101 and the p-FET device 102. It should be noted that in a typical CMOS RMG scheme is not possible to maintain the titanium nitride first metal layer 114.

Figure 9:
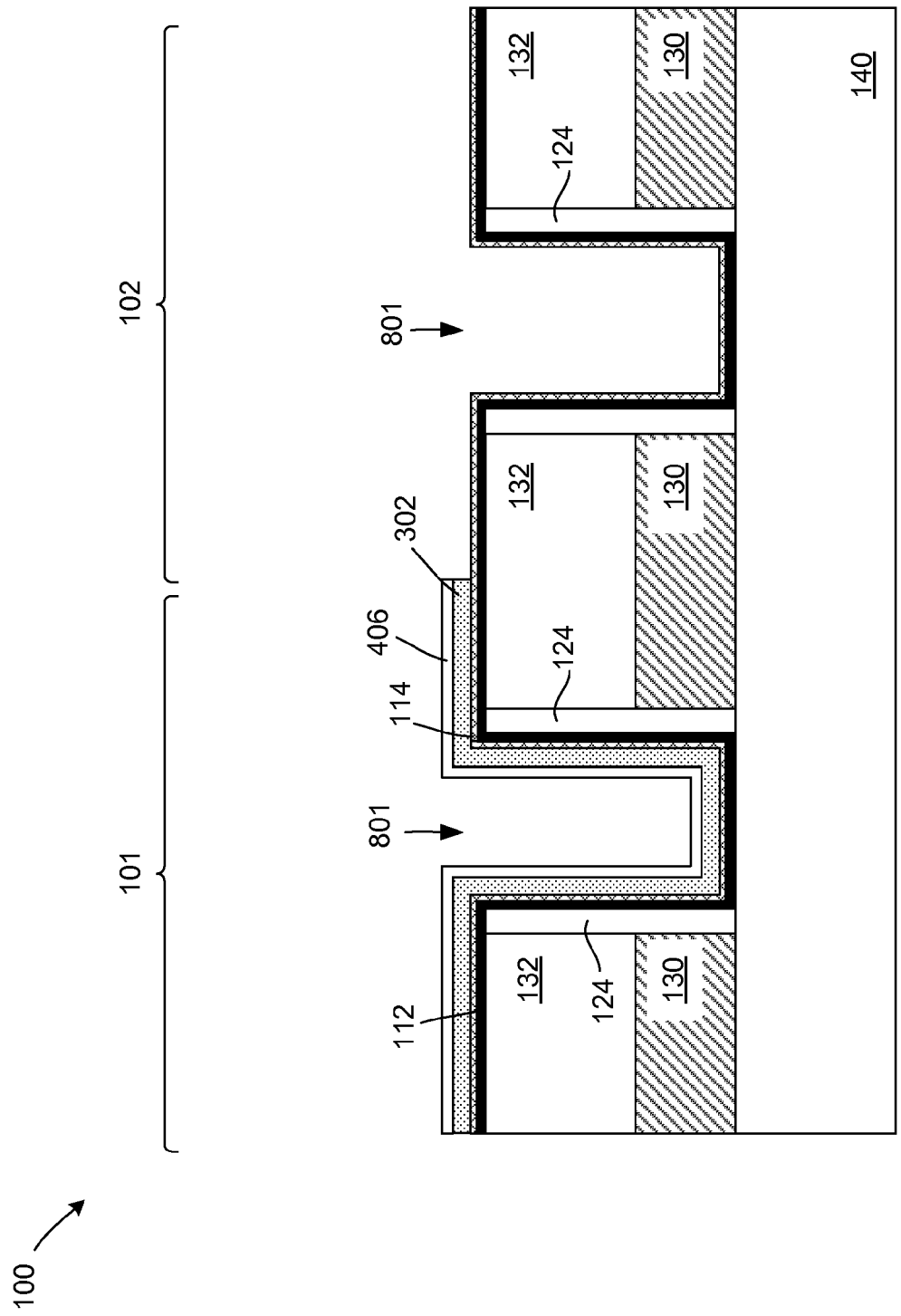
FIG. 9 is a cross-sectional view of the semiconductor structure depicting removing the protective layer, according to an embodiment of the present disclosure.

Referring now to FIG. 9, the protective layer 502 (FIG. 8) may be removed from the n-FET device 101, according to an embodiment of the present disclosure. The protective layer 502 (FIG. 8) may be removed by any etching technique known in the art. It should be noted that the process of removing the protective layer 502 (FIG. 8) may be typical and well known to those skilled in the art. In one embodiment where the protective layer 502 (FIG. 8) is an organic planarization layer, the protective layer 502 may be removed by, for example, a dry etch chemistry including $N_2$ and $H_2$ or $O_2$ or a strongly oxidizing wets.

At this point of the manufacturing process, third recesses 801 may remain in each of the n-FET device 101 and the p-FET device 102 as shown in the figure.

Figure 10:
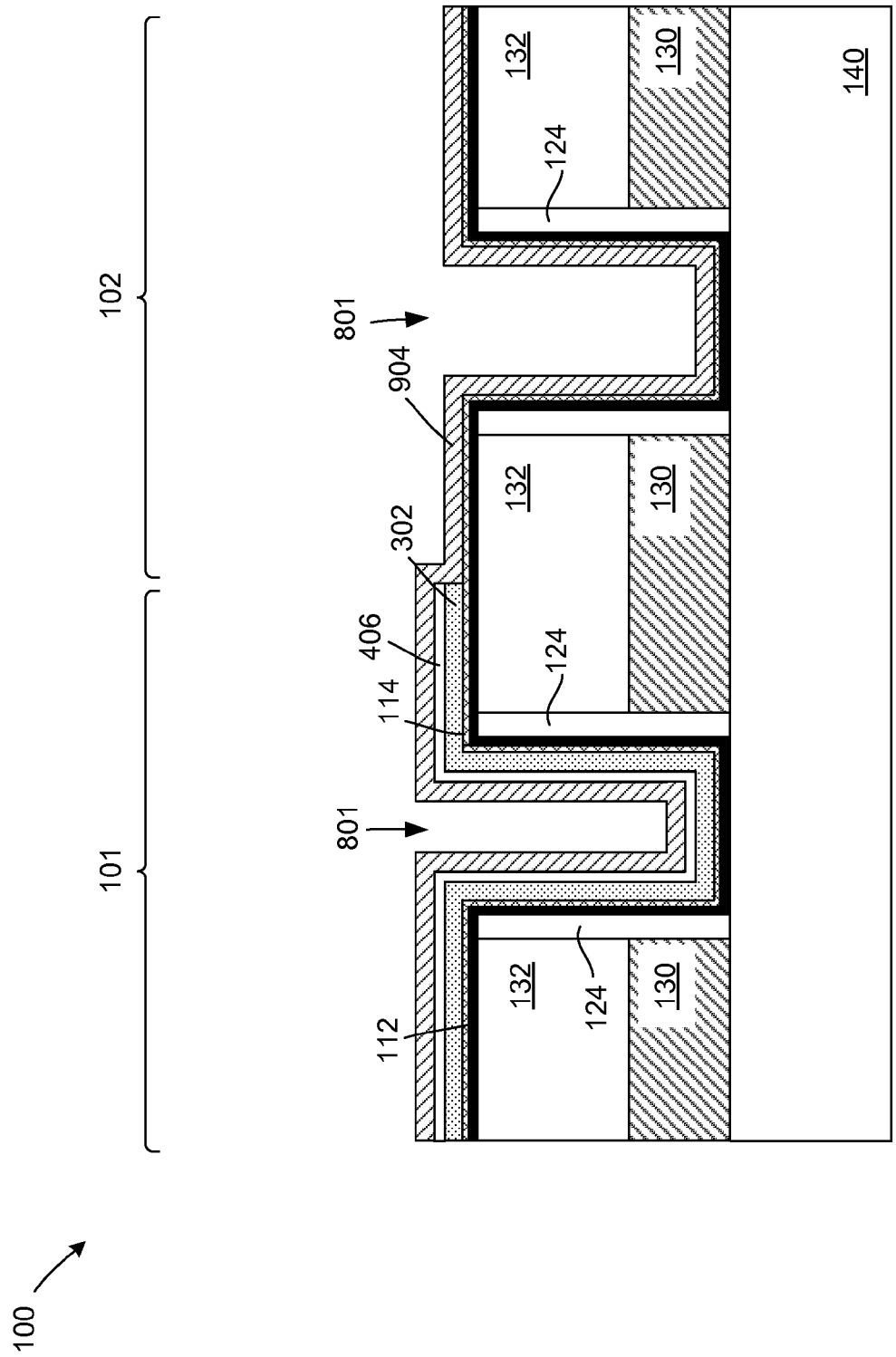
FIG. 10 is a cross-sectional view of the semiconductor structure depicting forming a fourth metal layer, according to an embodiment of the present disclosure.

Referring now to FIG. 10, a fourth metal layer 904 may be conformally deposited in the semiconductor structure 100, according to an embodiment of the present disclosure. The fourth metal layer 904 may substantially cover a perimeter of the third recesses 801. More specifically, the fourth metal layer 904 may be deposited above and in direct contact with the third metal layer 406 in the n-FET device 101 and above and in direct contact with the first metal layer 114 in the p-FET device 102. The fourth metal layer 904 may act as a wetting layer to facilitate adherence of a subsequently formed conductive layer. In the present embodiment, the fourth metal layer 904 may include titanium nitride and may be formed by any deposition method known in the art.

The fourth metal layer 904 may have a thickness ranging from approximately 0 nm to approximately 3 nm. In an embodiment the fourth metal layer 904 may be approximately less than 1.5 nm thick. It should be noted that due to the presence of the first metal layer 114 (titanium nitride reliability cap) and the deposition of the fourth metal layer 904 in a continuous and homogenous substrate (second metal layer 302), the fourth metal layer 904 (wetting layer) in the n-FET device 101 may be thinner than a fourth metal layer 904 formed following a traditional n-FET pattering scheme.

In embodiments in which the first metal layer is sufficiently thick, the fourth metal layer 904 may not be required. Conversely, in embodiments in which the first metal layer 114 is not sufficiently thick, the thinner titanium nitride wetting layer (fourth metal layer 904) may define the p-FET Vt and may be used as wetting (and protective) layer for low resistance gate electrode fill.

The thinner fourth metal layer 904 (wetting layer) may allow more space to be created in the semiconductor structure 100 for subsequent deposition of a low resistance conductive material (e.g. tungsten), which may help reducing n-FET gate resistance. According to one embodiment, an additional space may be created in the n-FET device 101 as a result of the thinner fourth metal layer 904 which may be used for deposition of a low resistance conductive material. This in turn may substantially lower gate resistance in the n-FET device 101.

Experimental results showed that by forming the n-FET and p-FET metal gate stacks following the proposed RMG scheme, the n-FET metal gate resistance may be reduced by approximately 200-400 ohm/per square while reliability of the p-FET device may be improved by approximately 150 mV by using voltage ramp stress after correcting the workfunction difference.

Figure 11:
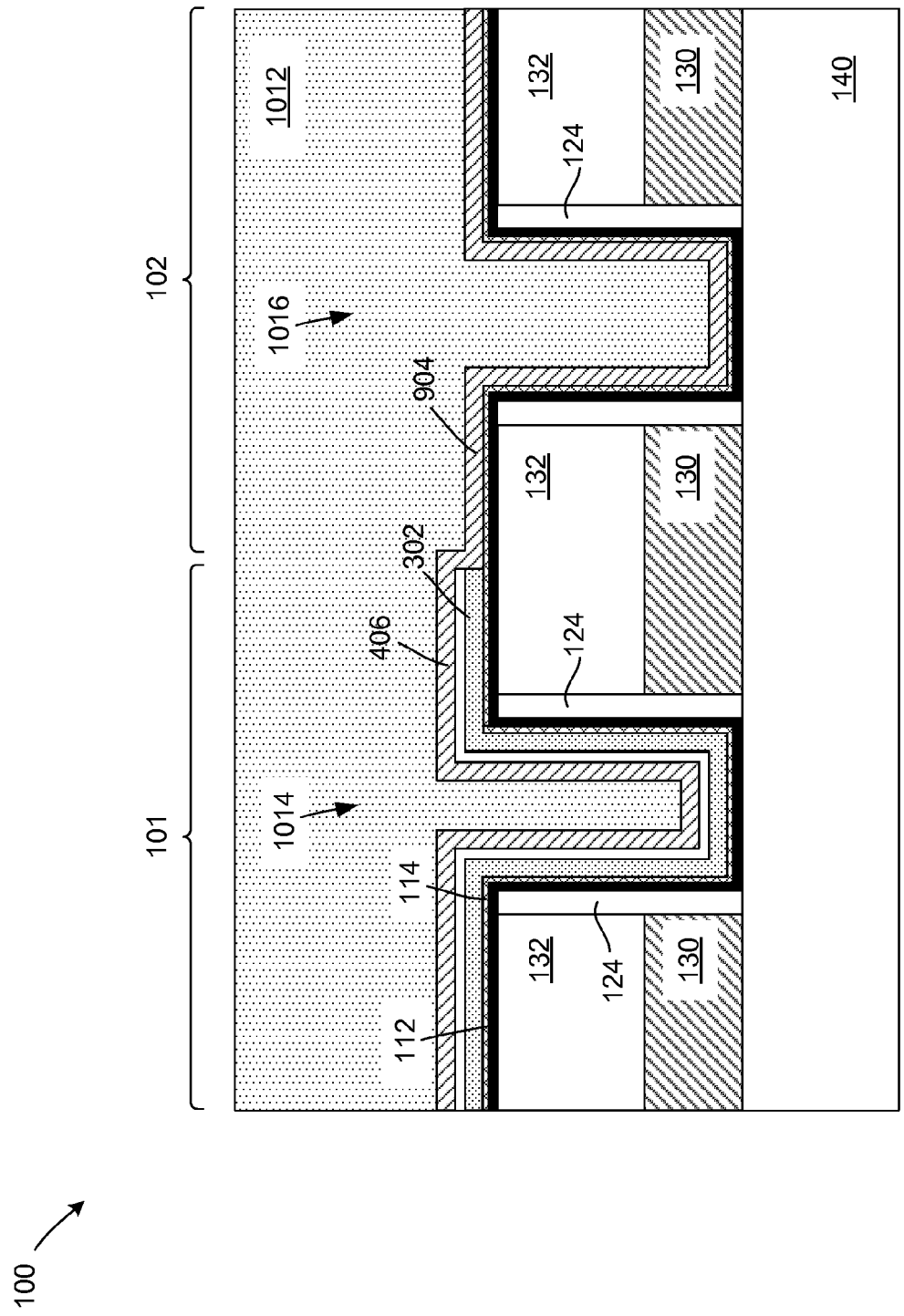
FIG. 11 is a cross-sectional view of the semiconductor structure depicting depositing a conductive material, according to an embodiment of the present disclosure.

Referring now to FIG. 11, a conductive material 1012 may be deposited in the semiconductor structure 100 substantially filling a remaining portion of the third recesses 801 (FIG. 10) above the fourth metal layer 904, according to an embodiment of the present disclosure. The conductive material 1012 may complete the metal gate stacks for the n-FET device 101 and the p-FET device 102, respectively. At this point of the manufacturing process, an n-type metal gate 1014 and a p-type metal gate 1016 may be formed in the semiconductor structure 100. The conductive material 1012 may typically include a low resistance material such as tungsten (W) and may be deposited by any known deposition technique known in the art such as CVD.

Figure 12:
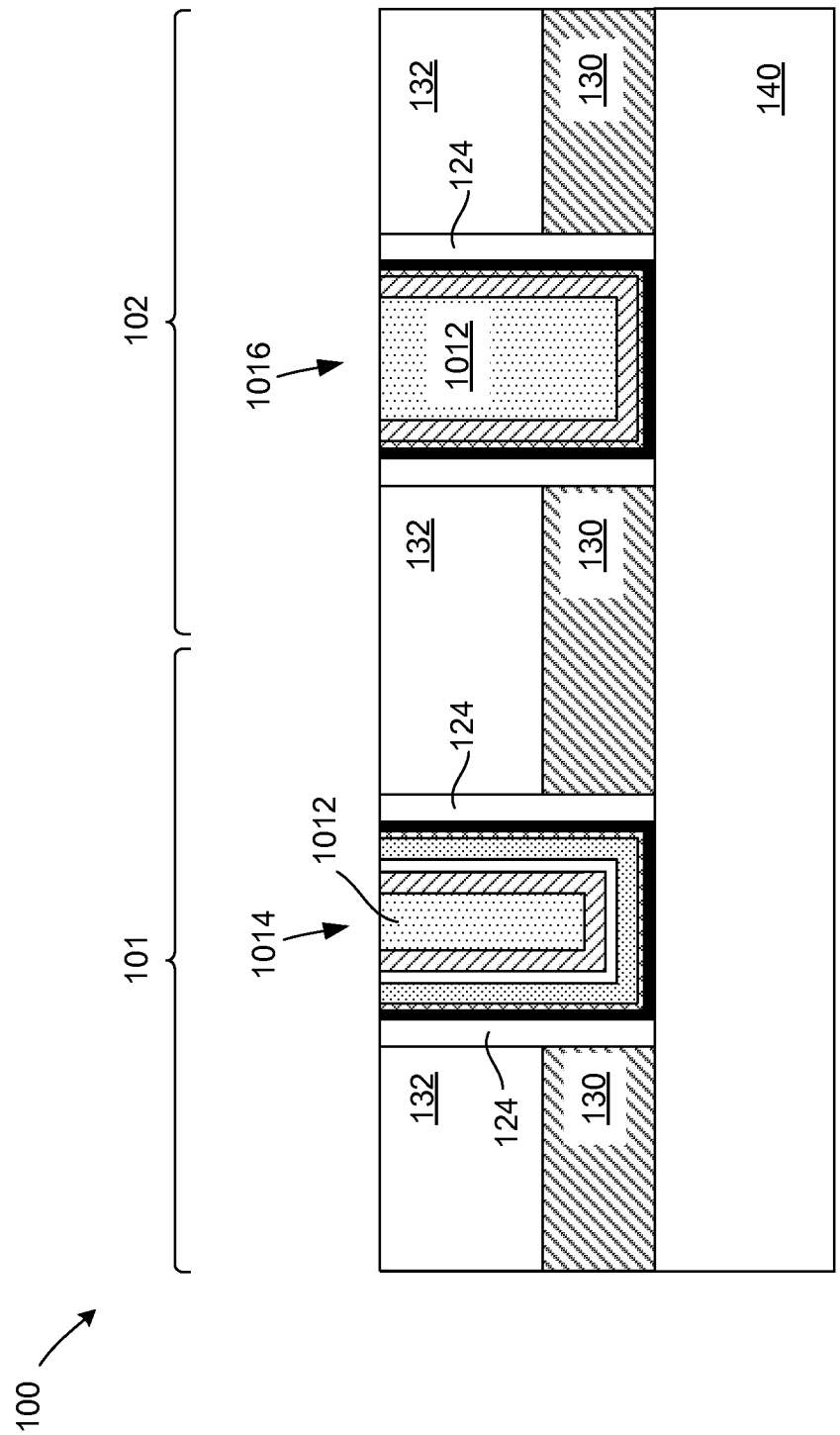
FIG. 12 is a cross-sectional view of the semiconductor structure depicting planarizing the conductive material, according to an embodiment of the present disclosure.

Referring now to FIG. 12, a planarization process may be conducted to remove excessive materials from the semiconductor structure 100, according to an embodiment of the present disclosure. For example, a chemical mechanical process (CMP) may be conducted so that a top surface of the n-type metal gate 1014 and of the p-type metal gate 1016 may be substantially flush with a top surface of the interlevel dielectric layer 132.

It should be noted that, the proposed RMG scheme may allow the titanium nitride wetting layer (e.g. fourth metal layer 904) to have substantially the same thickness in the n-FET device 101 and the p-FET device 102, as apposed to typical RMG schemes in which different thickness have been observed.

Figure 13:
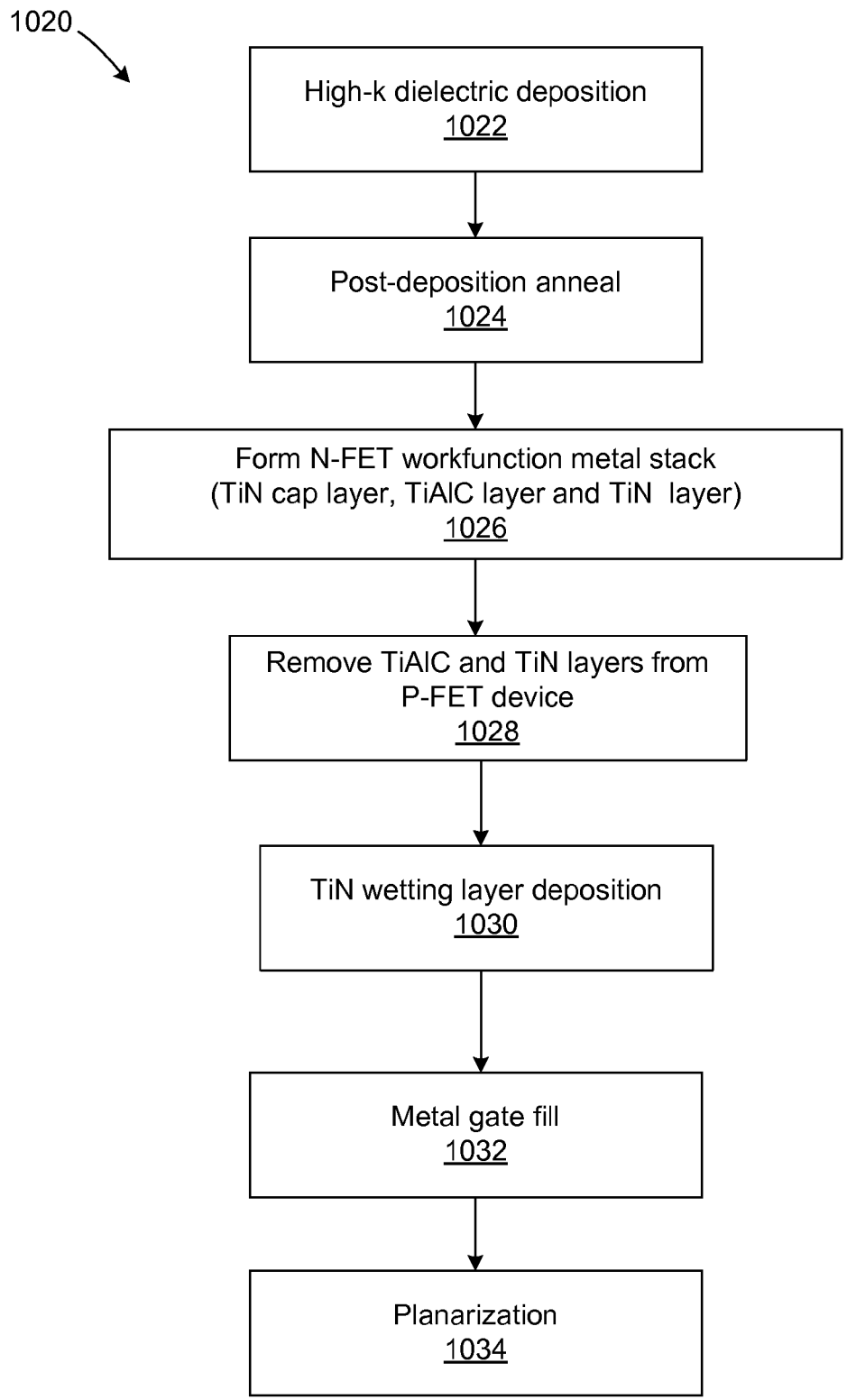
FIG. 13 is a flowchart depicting processing steps of a method to form n-FET and p-FET devices having reduced gate resistance, according to an embodiment of the present disclosure.

Referring now to FIG. 13, a flowchart 1020 depicting processing steps of a method to form n-FET devices having reduced gate resistance is shown, according to an embodiment of the present disclosure. The process begins at step 1022 with the deposition of a high-κ dielectric layer (e.g. gate dielectric layer 112). A post-deposition annealing treatment may be conducted at step 1024. Subsequently, the n-FET workfunction metal stack may be formed at step 1026 by depositing the first metal layer 114, the second metal layer 302, and the third metal layer 406. At step 1028, the second metal layer 302 and the third metal layer 406 may be removed from the p-FET device, without removing them from the n-FET device, to form the p-FET workfunction metal stack. It should be noted that the processing step 1028 may take place due to the highly selective wet etch chemistry solution described above. A fourth metal layer 904 (e.g. wetting TiN layer) may be deposited above and in direct contact with the n-FET and p-FET workfunction metal stacks at step 1030. Then the n-FET and p-FET metal gates may be completed by filling a remaining space within the n-FET and p-FET devices with a low resistance conductive material such as tungsten (step 1032). A planarization process may be conducted at step 1034 to remove excessive material from the n-FET and p-FET metal gates.

Therefore, by using a wet etch chemistry solution with a substantially high TiAlC to TiN etch ratio, a TiN cap layer may remain in the p-FET and n-FET devices protecting a high-κ dielectric layer and allowing for a thinner TiN wetting layer to be deposited in the n-FET device, this may in turn create more space for depositing a low resistance conductive material. As a result, n-FET gate resistance may be reduced. Additionally, in the p-FET device, a bi-layer stack consisting of the TiN cap layer and the TiN wetting layer may improve NBTI and lower Vt for enhanced device performance and reliability.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

The invention claimed is:

1. A method comprising:
    forming an n-FET device and a p-FET device on a substrate, wherein each of the n-FET device and the p-FET device include a metal gate stack comprising a titanium-aluminum carbide (TiAlC) layer above and in direct contact with a titanium nitride (TiN) cap; and
    removing, from the p-FET device, the TiAlC layer selective to the TiN cap,
    wherein removing the TiAlC layer comprises using a selective TiAlC to TiN wet etch chemistry solution with a substantially high TiAlC to TiN etch ratio such that the TiN cap remains in the p-FET device.

2. The method of claim 1, wherein the selective TiAlC to TiN wet etch chemistry solution comprises hydrogen peroxide ($H_2O_2$) and ammonia ($NH_4OH$) in a $H_2O_2$ to $NH_4OH$ ratio of approximately 1:0.8 to approximately 1:10.

3. The method of claim 1, wherein the selective TiAlC to TiN wet etch chemistry solution comprises a concentration of $NH_4OH$ greater than 2% volume.

4. The method of claim 1, wherein the substantially high TiAlC to TiN etch ratio is approximately 25:1.

5. The method of claim 1, wherein the substantially high TiAlC to TiN etch ratio is achieved by reducing the ratio of $H_2O_2$ to $NH_4OH$ at a fixed $H_2O_2$ concentration in the wet etch chemistry solution.

6. The method of claim 1, wherein the TiN cap comprises an annealed TiN layer that prevents the TiAlC layer from directly contacting a high-κ dielectric layer for improved reliability of the high-κ dielectric layer.

7. The method of claim 1, wherein the TiN cap remaining in the p-FET device improves a negative-bias temperature instability (NBTI) and lowers a threshold voltage (Vt) of the p-FET device.

8. A method comprising:
    forming, on a semiconductor substrate, an n-FET device and a p-FET device, each of the n-FET and p-FET devices comprises a dummy gate;
    removing the dummy gate in the n-FET device and the p-FET device, wherein removing the dummy gate creates a first recess in each of the n-FET device and the p-FET device;
    depositing in the first recess a high-κ dielectric layer, the high-κ dielectric layer substantially covering a perimeter of the first recess;
    depositing a first metal layer above and in direct contact with the high-κ dielectric layer, the first metal layer comprising a TiN cap, wherein a portion of the first recess remains above the first metal layer to become a second recess;
    depositing, in the second recess, a second metal layer comprising TiAlC, the second metal layer located above and in direct contact with the first metal layer;
    depositing a third metal layer comprising TiN, the third metal layer located above and in direct contact with the second metal layer, wherein the high-κ dielectric layer, the first metal layer, the second metal layer and the third metal layer form an n-type metal gate stack for the n-FET device;

depositing a protective layer substantially covering the n-FET device;

etching the third metal layer from the p-FET device selective to the second metal layer, wherein etching the third metal layer comprises using a first wet etch chemistry solution including hydrogen peroxide ($H_2O_2$); and etching the second metal layer from the p-FET device selective to the first metal layer, wherein etching of the second metal layer comprises using a second wet etch chemistry solution with a substantially high TiAlC to TiN etch ratio such that the first metal layer remains in the p-FET device.

9. The method of claim 8, wherein the second wet etch chemistry solution comprises $H_2O_2$ and ammonia ($NH_4OH$) in a $H_2O_2$ to $NH_4OH$ ratio of approximately 1:0.8 to approximately 1:10.

10. The method of claim 8, wherein the second wet etch chemistry comprises a concentration of $NH_4OH$ greater than 2% volume.

11. The method of claim 8, wherein the substantially high TiAlC to TiN etch ratio is approximately 25:1.

12. The method of claim 8, wherein the substantially high TiAlC to TiN etch ratio is achieved by reducing the ratio of $H_2O_2$ to $NH_4OH$ at a fixed $H_2O_2$ concentration in the wet etch chemistry solution.

13. The method of claim 8, wherein the TiN cap layer comprises an annealed TiN layer that prevents the second metal layer and the third metal layer from directly contacting the high-κ dielectric layer for improved reliability of the high-κ dielectric layer.

14. The method of claim 8, wherein the TiN cap layer remaining in the p-FET device improves a negative-bias temperature instability (NBTI) and lowers a threshold voltage (Vt) of the p-FET device.

15. The method of claim 8, further comprising:
removing the protective layer from the n-FET device;
depositing a fourth metal layer comprising TiN, the fourth metal layer located above and in direct contact with the third metal layer in the n-FET device and above and in direct contact with the first metal layer in the p-FET device, the fourth metal layer facilitates adherence of a low resistance conductive material in the n-FET device and the p-FET device,
wherein a third recess is located directly above the fourth metal layer;
depositing the low resistance conductive material above and direct contact with the fourth metal layer, the low resistance conductive material substantially filling the third recess.

16. The method of claim 8, wherein the fourth metal layer in the n-FET device and the fourth metal layer in the p-FET device have a substantially similar thickness.

17. A structure comprising:
an n-FET device and a p-FET device on a semiconductor substrate,
wherein the n-FET device includes a first metal gate stack comprising a first high-κ dielectric layer, a first TiN cap directly above the first high-κ dielectric layer, a first TiAlC layer directly above the first TiN cap, a first TiN layer directly above the first TiAlC layer, a first wetting TiN layer and a first low resistance conductive material directly above the first wetting TiN layer,
wherein the p-FET device includes a second metal gate stack comprising a second high-κ dielectric layer, a second TiN cap directly above the second high-κ dielectric layer, a second wetting TiN layer and a second low resistance conductive material directly above the second wetting TiN layer.

18. The structure of claim 17, wherein the first wetting TiN nitride layer and the second wetting TiN layer have a substantially similar thickness.

19. The structure of claim 17, wherein the first TiN cap and the second TiN cap comprise an annealed TiN layer that prevents the first TiAlC layer and the second wetting TiN layer from directly contacting the high-κ dielectric layer for improved reliability of the high-κ dielectric layer.

20. The method of claim 17, wherein the second TiN cap layer improves a negative-bias temperature instability (NBTI) and lowers a threshold voltage (Vt) of the p-FET device.

* * * * *